United States Patent
Bull et al.

(10) Patent No.: US 7,843,760 B2
(45) Date of Patent: Nov. 30, 2010

(54) INTERFACE CIRCUIT AND METHOD FOR COUPLING BETWEEN A MEMORY DEVICE AND PROCESSING CIRCUITRY

(75) Inventors: David Michael Bull, Cambridge (GB); Shidhartha Das, Cambridge (GB)

(73) Assignee: ARM Limited, Cambridge (GB)

( * ) Notice: Subject to any disclaimer, the term of this patent is extended or adjusted under 35 U.S.C. 154(b) by 71 days.

(21) Appl. No.: 12/382,428

(22) Filed: Mar. 16, 2009

(65) Prior Publication Data
US 2010/0232250 A1 Sep. 16, 2010

(51) Int. Cl.
*G11C 8/00* (2006.01)
(52) U.S. Cl. .............. 365/230.06; 365/230.08; 365/189.011
(58) Field of Classification Search ............ 365/230.06, 365/230.08, 189.011
See application file for complete search history.

(56) References Cited

U.S. PATENT DOCUMENTS 6,078,527 A * 6/2000 Roth et al. ............. 365/189.04
6,414,900 B1 * 7/2002 Spriggs et al. .......... 365/230.06

OTHER PUBLICATIONS

U.S. Appl. No. 10/392,382, Takeda, filed Mar. 20, 2003.
U.S. Appl. No. 11/267,574, Blaauw, filed Nov. 7, 2005.
U.S. Appl. No. 11/121,309, Bull, filed May 4, 2005.
U.S. Appl. No. 12/068,598, Bull, filed Feb. 8, 2008.

* cited by examiner

*Primary Examiner*—Huan Hoang
(74) *Attorney, Agent, or Firm*—Nixon & Vanderhye P.C.

(57) ABSTRACT

Interface circuitry is provided for coupling between a memory device and processing circuitry, the processing circuitry issuing a plurality of access signals relating to accesses to be performed in the memory device. The interface circuitry comprises write address latch circuitry for storing a write address signal, and write address decoder circuitry that is responsive to a set first enable signal to decode the write address signal provided from the write address latch circuitry. Further, read address latch circuitry is provided for storing a read address signal issued by the processing circuitry, and read address decoder circuitry is responsive to a set second enable signal for decoding the read address signal provided from the read address latch circuitry. Decoder select latch circuitry is responsive to an access type indication signal from the processing circuitry to generate the first and second enable signals in dependence on that access type indication signal. In the event of metastability occurring in the decoder select latch circuitry, the decoder select latch circuitry is arranged not to set at least the second enable signal, thereby disabling at least the read address decoder circuitry in the presence of such metastability. Such an approach prevents metastable signals being used in the arbitration of data accesses in a manner which could corrupt the state of the memory device.

19 Claims, 6 Drawing Sheets

INTERFACE CIRCUIT AND METHOD FOR COUPLING BETWEEN A MEMORY DEVICE AND PROCESSING CIRCUITRY

BACKGROUND OF THE INVENTION

1. Field of the Invention

The present invention relates to an interface circuit and method for coupling between a memory device and processing circuitry 2. Description of the Prior Art In a data processing apparatus, such as a pipelined data processing apparatus, a series of serially connected stages are formed. The processing circuitry of each processing stage is responsive to input signals received from preceding processing stages in the pipeline or from elsewhere and generates output signals. Between each stage of the pipeline is provided a signal capture element such as a latch or a sense amplifier into which one or more signal values are stored. The latch receives the input signals, stores the input signal value and presents this stored value on its output in response to a clock signal provided thereto.

In order for the latch to reliably store the input signals provided at its input, it is necessary for the input signal to achieve a particular voltage level representative of a value to be stored at a time which is no later than a predetermined period prior to the clock signal being provided to the latch (known as the set-up period) and for this voltage level to be maintained for a predetermined period following the provision of the clock signal (known as the hold period).

However, in the event that the input signals provided to the latch transitions in the set-up or hold period then metastability can occur. A consequence of this is that the output provided by the latch does not make a clean transition between logic levels but instead achieves a value somewhere therebetween, known as a metastable voltage. Typically, the metastable voltage is a level approximately midway between the valid logic level voltages.

Metastability is typically avoided by ensuring that the input signals only transition outside of the set-up and hold periods. This ensures that the input signals can be cleanly sampled by the latch.

However, in order to attempt to improve the performance of data processing apparatuses, it is known to increase the speed at which the processing stages are driven by increasing the clock rate until the slowest processing stage in the pipelined processor is unable to keep pace. Also, in situations where it is desired to reduce the power consumption of the data processing apparatus, it is known to reduce the operating voltage up to the point at which the slowest processing stage is no longer to keep pace. In both of these situations it is no longer possible to ensure that the signal transitions do not occur within the set-up and hold periods and metastability can occur. An example of an integrated circuit arranged to operate under such conditions is described in commonly owned U.S. Pat. No. 7,278,080, the entire contents of which are hereby incorporated by reference.

A consequence of such metastability is that erroneous data values may be generated. In extreme cases, erroneous control signals may also be generated which may cause valid data to be corrupted. For example, should metastability occur whilst performing an access to a memory device then a corruption of the internal state of the memory may occur.

In order to avoid metastability causing corruption of the internal state of the memory device, write accesses to the memory device may be placed in a write queue. The write accesses are then only allowed to occur once a system level validation process has confirmed that the signals associated with the write access are valid and that no metastability in those signals exists.

However, placing read accesses to the memory in a read queue in an equivalent manner to write accesses would introduce delays when retrieving data. Introducing such delays would adversely reduce the overall performance of the data processing apparatus to unacceptable levels, due to the sensitivity of processing throughput on load latency.

Nevertheless, using signals produced directly by logic which may be metastable could lead to metastable signals in turn being provided to an address decoder used to access the memory. Commonly owned U.S. Pat. No. 7,263,015, the entire contents of which are hereby incorporated by reference, describes latch circuitry for read address signals which produces two outputs for input to the address decoder which in normal operation should be the inverse of each other. In such cases, the decoder uses one of the outputs to select the relevant wordline. However, in the event of metastability arising, the latch circuitry generates the two outputs at the same logic level, causing the address decoder to not activate any wordlines. As a consequence, no corruption in the state stored in the memory can result due to metastability in the read address input.

However, another problem that can arise is that one or more signals used to identify whether a write operation or a read operation should be performed may also suffer from metastability problems. In particular, arbitration techniques are typically provided in order to deal with the occurrence of concurrent read and write access over the common buses, with read accesses being given priority over write accesses. Accordingly, read accesses are performed in preference, with write accesses being placed in the write buffer and postponed until after the write access is confirmed to be error free and no read accesses are outstanding.

Often such arbitration techniques make use of a signal generated by the processing circuitry to indicate whether a read access is to take place. If such a signal is metastable then this may cause metastable signals to be used directly in the arbitration of data accesses. This in turn can result in many different types of errors occurring when accessing data. In an extreme case, these errors may cause the data to become corrupted. It will be appreciated that corrupting data is undesirable at the best of times; however, data corruption due to metastability is particularly disadvantageous since it will be almost impossible to determine the corruption occurred since it is extremely unlikely that the status of the signals causing the corruption can be determined.

Commonly owned U.S. patent application Ser. Nos. 11/121,309 and 12/068,598, the entire contents of which are hereby incorporated by reference, describe a prediction mechanism, where an indication that an instruction is to be processed by the pipelined data processing apparatus is received and a memory access prediction signal is then generated. The memory access prediction signal has a value indicative of whether or not the instruction is likely to cause a read access from a memory. Hence, an indication is provided when the instruction is likely to cause a read access. A predicted memory access control signal is generated from the memory access prediction signal.

The predicted memory access control signal is generated in a way which prevents any metastability being present in that signal. This is achieved by the predicted memory access control signal achieving and maintaining a valid logic level for at least a sampling period. A read access can then be initiated in the event that it is predicted that a read access is likely to occur.

In this way, a signal used to initiate a read access can be generated in a way which ensures that it will have no metastability. This is possible because that signal is merely a prediction signal rather than the decoded instruction itself and, hence, can be generated much earlier in the pipeline. Because the prediction signal is generated much earlier in the pipeline, it can be ensured that the signal used to cause the memory access has no metastability.

Whilst the above approach removes the possibility that metastable signals are used directly in the arbitration of data accesses, it requires the use of a prediction signal, which will hence require the need for correction mechanisms in the event that the prediction later proves to be wrong, thereby increasing complexity of the data processing apparatus. Accordingly it would be desirable to provide an improved technique for avoiding metastable signals being used in the arbitration of data accesses in a way which could corrupt state of the memory device.

SUMMARY OF THE INVENTION

Viewed from a first aspect, the present invention provides interface circuitry for coupling between a memory device and processing circuitry, the processing circuitry being arranged to issue a plurality of access signals relating to accesses to be performed in the memory device, the interface circuitry comprising: write address latch circuitry for storing a write address signal; write address decoder circuitry responsive to a set first enable signal to decode the write address signal provided from the write address latch circuitry; read address latch circuitry for storing a read address signal issued by the processing circuitry; read address decoder circuitry responsive to a set second enable signal for decoding the read address signal provided from the read address latch circuitry; and decoder select latch circuitry, responsive to an access type indication signal from the processing circuitry, to generate the first and second enable signals in dependence on said access type indication signal, in the event of metastability occurring in the decoder select latch circuitry, the decoder select latch circuitry being arranged to not set at least the second enable signal, thereby disabling at least the read address decoder circuitry in the presence of said metastability.

In accordance with the present invention, separate write address decoder circuitry and read address decoder circuitry are provided, which are enabled by respective first and second enable signals. Decoder select latch circuitry then generates the first and second enable signals in response to an access type indication signal from the processing circuitry. The timing of the access type indication signal may be such as to potentially cause metastability in the decoder select latch circuitry. In accordance with the present invention, in the event of such metastability occurring the decoder select latch circuitry is arranged to not set at least the second enable signal. Accordingly, in the presence of metastability, at least the read address decoder circuitry is not enabled, and accordingly no decoding of the read address signal issued by the processing circuitry will occur.

As a result, in the event of metastability in the signal used to arbitrate between read and write accesses, such a mechanism prevents any read address signals issued by the processing circuitry from being propagated to the memory device, thereby preventing any word lines whose activation could cause corruption of state required for future processing from being activated in the presence of such metastability. Accordingly, this mechanism tolerates metastable signals being used in the arbitration of data accesses when there is a possibility of those metastable signals corrupting the state of the memory device.

In one embodiment, in the event of metastability occurring in the decoder select latch circuitry the decoder select latch circuitry is arranged to not set the first enable signal and the second enable signal, thereby disabling both the write address decoder circuitry and the read address decoder circuitry in the presence of said metastability. Hence, in such embodiments neither the write address decoder nor the read address decoder circuitry are enabled in the presence of metastability, thereby preventing any access to the memory device in the presence of such metastability.

However, in an alternative embodiment, it is possible to allow write accesses to proceed in the presence of such metastability. In particular, in one embodiment, the write address signal in the write address latch circuitry identifies a location in the memory device at which performance of a write operation will not corrupt state required for future processing by the processing circuitry, and in the event of metastability occurring in the decoder select latch circuitry, the decoder select latch circuitry is arranged to set the first enable signal and to not set the second enable signal, thereby enabling the write address decoder circuitry and disabling the read address decoder circuitry in the presence of said metastability.

Hence, in such embodiments, a "safe" location is identified in the memory device at which a write can take place. This location could be some predetermined location where no data of interest to the processing circuit is stored, and accordingly that location can be written to without the risk of corrupting the operation of the data processing circuitry. Alternatively, in another embodiment, any write addresses issued by the processing circuitry may be guaranteed not to suffer from any metastability problems, and hence can be guaranteed to be valid write addresses at which the processing circuitry wishes to write data. Hence, by way of example, the processing circuitry may be arranged to generate such write address signals so that they are always stable prior to the start of the setup period, and are maintained at a stable level during the hold period. In a further alternative embodiment, the write address signals as issued by the processing circuitry may not be guaranteed to be free of such metastability problems, but may be buffered until a system level validation process has been performed to confirm that those write address signals are correct and that no metastability in those signals exists, so that by the time those write address signals are stored in the write address latch circuitry no metastability issues with respect to those write address signals exist.

The write address signal referred to above may be the basic write address signal identifying for example the location of a data word, or may include in addition a byte select signal identifying one or more specific bytes within that data word.

It should be noted that whilst the write address needs to be correct, there is no requirement for the write data to also be correct at the time the write operation takes place, provided a correction mechanism is provided for later correcting that data.

In one embodiment, the interface circuitry further comprises: a store buffer for buffering one or more write address signals issued by the processing circuitry, each write address signal only being output from the store buffer when determined to identify a location in the memory device at which performance of a write operation will not corrupt further operation of the processing circuitry; and said write address latch circuitry being arranged to store a write address signal as output by the store buffer.

As mentioned above, in one embodiment, the write address signals as issued by the processing circuitry may not exhibit any metastability problems, and hence may always identify locations at which the processing circuitry intends to perform the write operation. However, in embodiments where the write address signals to be buffered in the store buffer may potentially exhibit metastability problems, such as where the write address signals as issued by the processing circuitry are speculative (i.e. are output by the processing circuitry at a time before they are guaranteed to be correct, e.g. due to metastability, late evaluation, etc.), the interface circuitry may further comprise stabilization circuitry for receiving the write address signals issued by the processing circuitry, resolving those signals to non-speculative signals, and then providing the non-speculative write address signals to the store buffer. Hence, by such an approach, it can ensured that each write address signal is only output from the store buffer when it is determined to identify a location in the memory device at which performance of a write operation will not corrupt further operation of the processing circuitry.

The decoder select latch circuitry may be constructed in a variety of ways. However, in one embodiment, said decoder select latch circuitry has first and second internal nodes, said first enable signal being derived from a logic level of said first internal node, and said second enable signal being derived from a logic level of said second internal node. In a precharge phase, said first and second internal nodes are precharged to a first logic level, causing both the first and second enable signals to be unset, and in an active phase following the precharge phase, at most one of the first and second internal nodes is caused to transition towards a second logic level in dependence on said received access type indication signal, causing at most one of the first and second enable signals to be set. In the event of metastability occurring in the decoder select latch circuitry during the active phase, at least the second internal node is prevented from transitioning towards the said second logic level to a degree that would cause the second enable signal to be set. Hence, by such an approach, at least the read address decoder circuitry is disabled in the event of such metastability.

In one embodiment, the decoder select latch circuitry comprises: a capture element containing said first and second internal nodes; a first inverter for producing said first enable signal from the logic level of said first internal node; and a second inverter for producing said second enable signal from the logic level of said second internal node; at least the second inverter having a transfer characteristic which prevents the second enable signal being set in the event of metastability in the logic level at the second internal node, thereby disabling at least the read address decoder circuitry in the presence of said metastability. Hence, the second inverter ensures that the second enable signal remains at a voltage level interpreted by the read address decoder circuitry as being unset in the event that a logic level of the second internal node presents metastability.

In particular, in one embodiment, the transfer characteristic of at least the second inverter is skewed such that the voltage on the second internal node needs to transition beyond a metastable voltage level towards a voltage associated with the second logic level before the second inverter sets the second enable signal.

In one embodiment, the first inverter can be arranged to have the same transfer characteristic as the second inverter, so that both the first and second enable signals remain unset in the event of metastability. However, in an alternative embodiment, the first inverter has a transfer characteristic which causes the first enable signal to be set in the event of metastability in the logic level at the first internal node, thereby enabling the write address decoder circuitry in the presence of said metastability. Hence, in this embodiment the first inverter has a transfer characteristic which causes the first enable signal to transition to a voltage level interpreted by the write address decoder circuitry as a set enable signal should the logic level at the first internal node present metastability (i.e. fail to transition to a valid logic level) during the active phase. In particular, in one embodiment, the transfer characteristic of the first inverter is skewed such that if the voltage on the first internal node transitions to a metastable voltage level this causes the first inverter to set the first enable signal.

The access type indication signal issued by the processing circuitry may take a variety of forms. However, in one embodiment the access type indication signal is used to produce a write enable signal stored in the decoder select latch circuitry. In one particular embodiment, the access type indication signal is a load signal used to identify whether a read operation is being performed. In this instance, the write enable signal is set if the load signal is not set and there is a pending write access to be performed.

The read address latch circuitry can take a variety of forms. However, in one embodiment, the read address latch circuitry comprises for each bit of the read address signal: a capture element having first and second internal nodes, from which first and second read address output signals are derived; in a precharge phase, said first and second internal nodes are precharged to a first logic level, causing both the first and second read address output signals to be unset; in an active phase following the precharge phase, at most one of the first and second internal nodes is caused to transition towards a second logic level in dependence on said received read address signal, causing at most one of the first and second read address output signals to be set; and in the event of metastability occurring in the capture element during the active phase, both the first and second internal nodes being prevented from transitioning towards the said second logic level to a degree that would cause either of the first and second read address output signals to be set; the read address decoder preventing a read access to the memory device taking place in the event that the first and second read address output signals are both unset. Hence, in such embodiments, in the event of metastability occurring in the capture element due to the read address signal, the read address decoder prevents a read access to the memory device taking place.

In one embodiment, the read address latch circuitry further comprises for each bit of the read address signal: a first inverter for producing said first read address output signal from the logic level of said first internal node; and a second inverter for producing said second read address output signal from the logic level of said second internal node; said first and second inverters having a transfer characteristic which prevents the first and second read address output signals being set in the event of metastability in the logic level at the first and second internal nodes.

In one particular embodiment, the read address latch circuitry can take the form described in commonly owned U.S. Pat. No. 7,263,015.

The memory device can take a variety of forms. However, in one embodiment the memory device comprises a plurality of RAM memory cells. In one particular embodiment, each RAM memory cell may be a 6T SRAM memory cell.

The memory device may take a variety of forms, but in one embodiment the memory device is part of a cache associated with the processing circuitry. In an alternative embodiment, the memory device may be a storage structure within a memory management unit, such as a Translation Lookaside Buffer (TLB).

In yet a further embodiment, the memory device may be a RAM based FIFO storage structure. In such an embodiment, the processing circuitry forms consuming circuitry for reading data stored in the FIFO storage structure, the write address signal identifies a location within the FIFO storage structure to which data is to be written, and the read address signal identifies a location within the FIFO structure from which the processing circuitry is to read the data.

Viewed from a second aspect, the present invention provides interface circuitry for coupling between memory means and processing means, the processing means for issuing a plurality of access signals relating to accesses to be performed in the memory means, the interface circuitry comprising: write address latch means for storing a write address signal; write address decoder means, responsive to a set first enable signal, for decoding the write address signal provided from the write address latch means; read address latch means for storing a read address signal issued by the processing means; read address decoder means, responsive to a set second enable signal, for decoding the read address signal provided from the read address latch means; and decoder select latch means, responsive to an access type indication signal from the processing means, for generating the first and second enable signals in dependence on said access type indication signal, in the event of metastability occurring in the decoder select latch means, the decoder select latch means not setting at least the second enable signal, thereby disabling at least the read address decoder means in the presence of said metastability.

Viewed from a third aspect, the present invention provides a method of coupling a memory device to processing circuitry, the processing circuitry being arranged to issue a plurality of access signals relating to accesses to be performed in the memory device, the method comprising the steps of: storing a write address signal in write address latch circuitry; responsive to a set first enable signal, decoding the write address signal provided from the write address latch circuitry; storing in read address latch circuitry a read address signal issued by the processing circuitry; responsive to a set second enable signal, decoding the read address signal provided from the read address latch circuitry; responsive to an access type indication signal from the processing circuitry, generating from decoder select latch circuitry the first and second enable signals in dependence on said access type indication signal; and in the event of metastability occurring in the decoder select latch circuitry, not setting at least the second enable signal, thereby disabling at least the decoding of the read address signal in the presence of said metastability.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
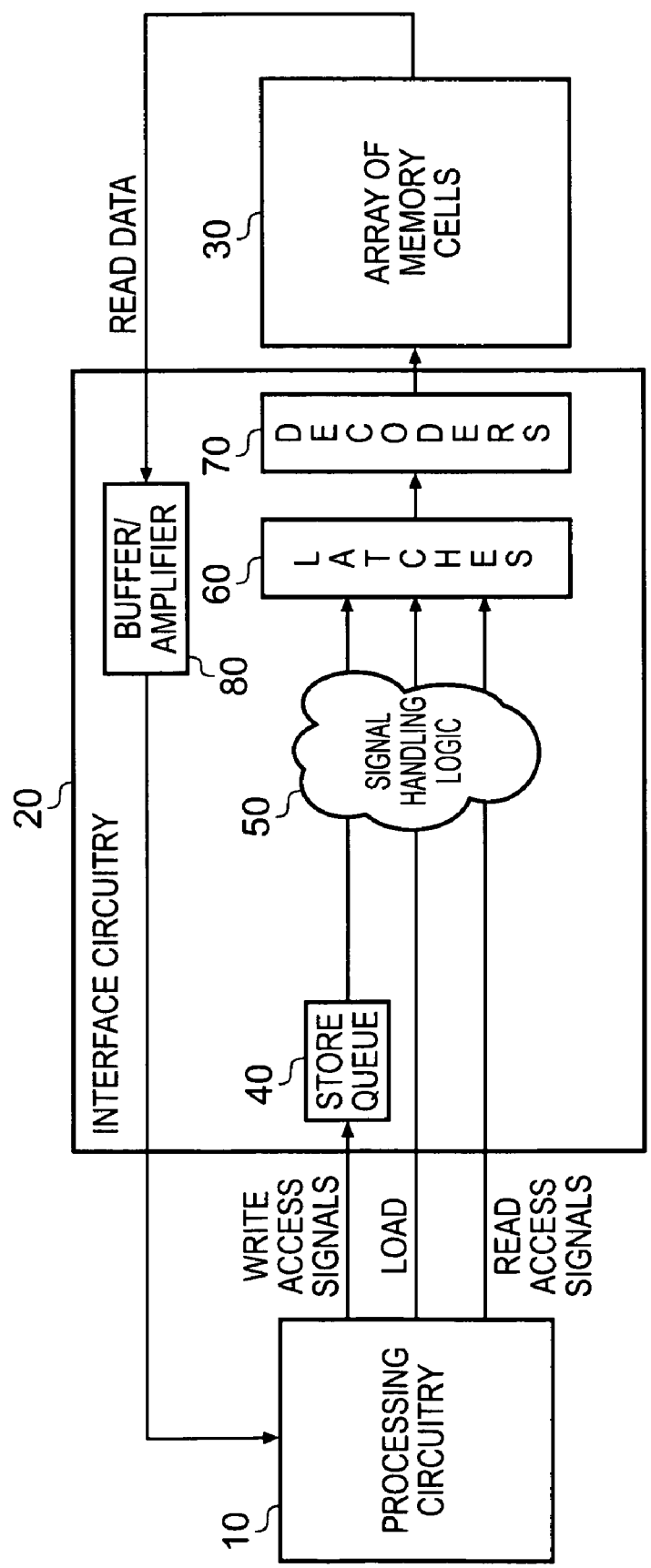
FIG. 1 is a block diagram of a data processing apparatus in which embodiments of the present invention may be employed.

FIG. 1 illustrates a data processing apparatus in which embodiments of the present invention may be employed. Processing circuitry 10 is coupled via interface circuitry 20 to an array of memory cells 30 of a memory device. Any write or read access requests issued by the processing circuitry 10 are received by the interface circuitry 20 from where they are then issued to the memory device.

As shown in FIG. 1, write access signals may be stored within a store queue 40 within the interface circuitry 20, whilst read access signals are not buffered and instead are handled directly to the signal handling logic 50. The buffering of write accesses allows a system level validation process to be performed to confirm that the signals associated with the write access are valid and that no metastability in those signals exists, before any of those signals are passed to the signal handling logic 50. However since read accesses tend to be on the critical path, it is not appropriate to buffer read accesses in a similar way to write accesses.

The signal handling logic receives the output from the store queue 40, the read access signals and an access type indication signal referred to in FIG. 1 as a load signal. This load signal identifies whether the processing circuitry is seeking to perform a read operation.

Based on these various signals, the signal handling logic generates a variety of output signals for storing in the latches 60, from where those signals are then provided to decoder circuitry 70 in order to produce the required control signals to perform the required access within the memory cells 30 of the memory device. By such an approach, in the event of a write operation taking place, the relevant memory cells can be activated and the write operation performed, and in the event of a read operation, the relevant memory cells can be activated, and the read data deduced from the outputs on their associated bit lines, with the read data being returned to the processing circuitry via a buffer/amplifier circuit 80.

Whilst the interface circuitry 20 may in one embodiment be separate from the memory device itself, in another embodiment at least some of the components of the interface circuitry will be provided internally within the memory device, and indeed in one particular embodiment all of the components of the interface circuitry may be provided internally within the memory device.

Figure 2:
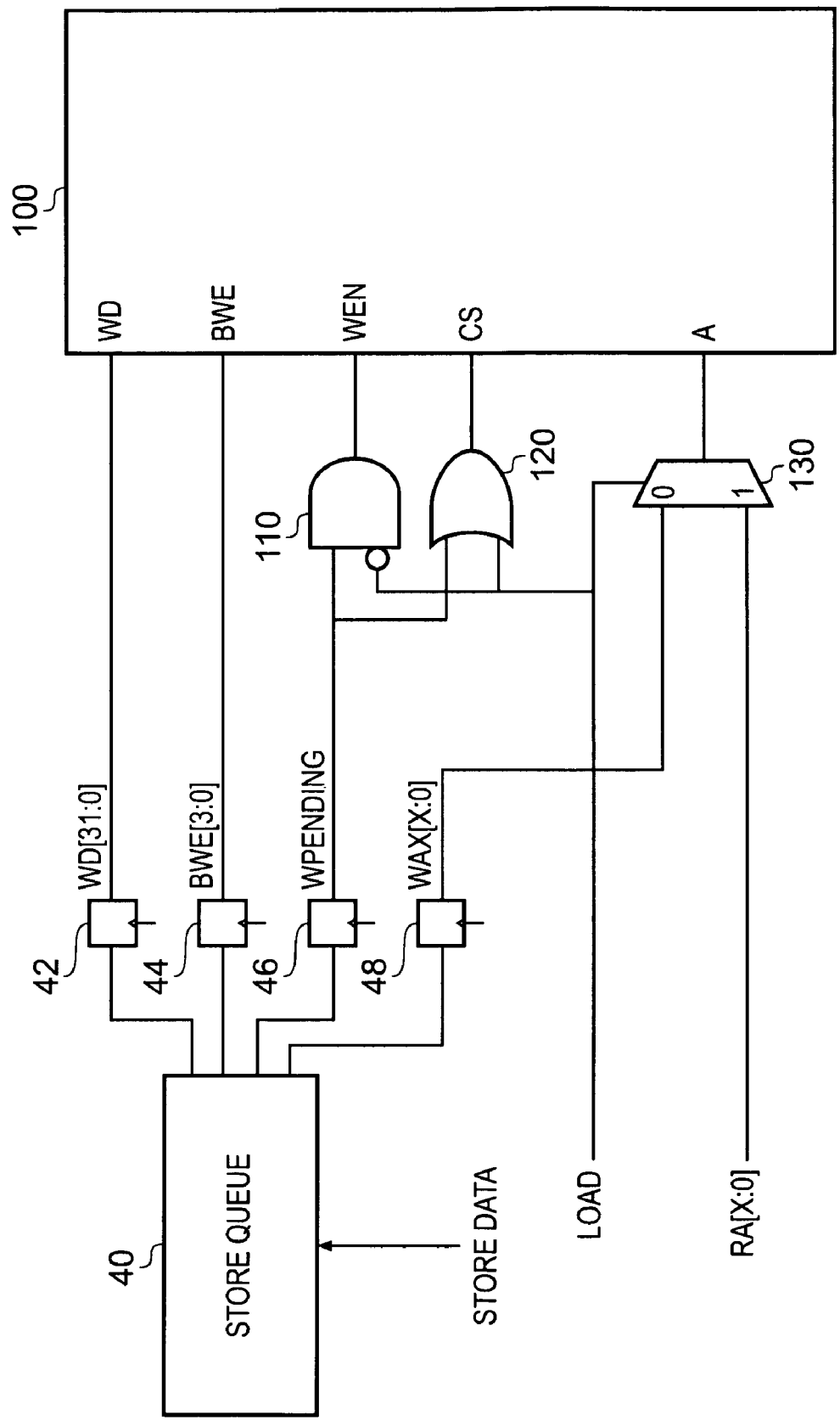
FIG. 2 schematically illustrates a prior art mechanism for generating signals to be latched by a memory device.

FIG. 2 illustrates a memory device and associated interface circuitry in accordance with a prior art arrangement. In this embodiment, the latches 60, decoder 70 and memory cells 30 of FIG. 1 are all contained within the element 100 of FIG. 2, whilst the signal handling logic 50 of FIG. 1 is formed by the components 110, 120 and 130 of FIG. 2. As can be seen, write access signals in the form of store data are stored in the store queue 40, which in one embodiment operate as a first-in-first-out (FIFO) queue. The signals pertaining to a write access request at the front of the queue are output to the latches 42, 44, 46, 48. In particular, in this embodiment, four signals are issued, namely a write address stored in the latch 48, write data stored in the latch 42, a write pending signal stored in the latch 46 which is set to identify a valid pending write operation, and a byte write enable signal 44 which can be used as a mask to identify particular bytes to be written to. In the particular example shown, the byte write enable signal is a four bit signal allowing each of the four bytes in an accessed data word to be identified, thereby allowing any selection of bytes within the data word to be written to. It will be appreciated that in alternative embodiments the byte write enable signal may be omitted.

Whilst the data to be written to the memory device is buffered using the store queue 40, read access requests (which correspond to load instructions) are performed immediately. Accordingly, some form of arbitration mechanism must exist between the reads and pending writes. As the latency of load instructions is typically critical to the performance of a microarchitecture, such reads typically have priority over writes. This is achieved using the components 110, 120 and 130 shown in FIG. 2. In particular, if the load signal is set high, this will cause the write enable signal output by the AND gate 110 to be unset irrespective of the write pending signal output by the latch 46. Conversely, if the load signal is not set, then in the event of a pending write the output from the AND gate 110 will be set high, thereby setting the write enable signal. The OR gate 120 is used to produce a set chip select signal if either there is a pending write indicated by a set signal in the latch 46 or a pending read indicated by a set load signal.

As also shown in FIG. 2, the load signal is used to control the multiplexer 130 to choose between the write address stored in the latch 48 or the read address issued by the processing circuit, dependent on whether the load signal is set or not.

As will be appreciated, the arrangement of FIG. 2 leads to a design where the chip select, address and write enable inputs to the memory device are all controlled by a load signal produced from the execute stage of the processing circuit's pipeline. However, if the processing circuitry is run in a manner whereby it cannot be guaranteed that the load signal will be stable prior to the set up period and remain stable for the hold period, then the use of the load signal in this way can lead to metastability problems which could cause corruption to the state of the data stored in the memory device. For example, if a write is pending then there is the possibility that the load signal can interfere with both the write enable and address inputs. In the worst case the write enable is interpreted as set at the memory interface with the address input being scrambled. This could result in one or more arbitrary memory locations being overwritten.

Figure 3:
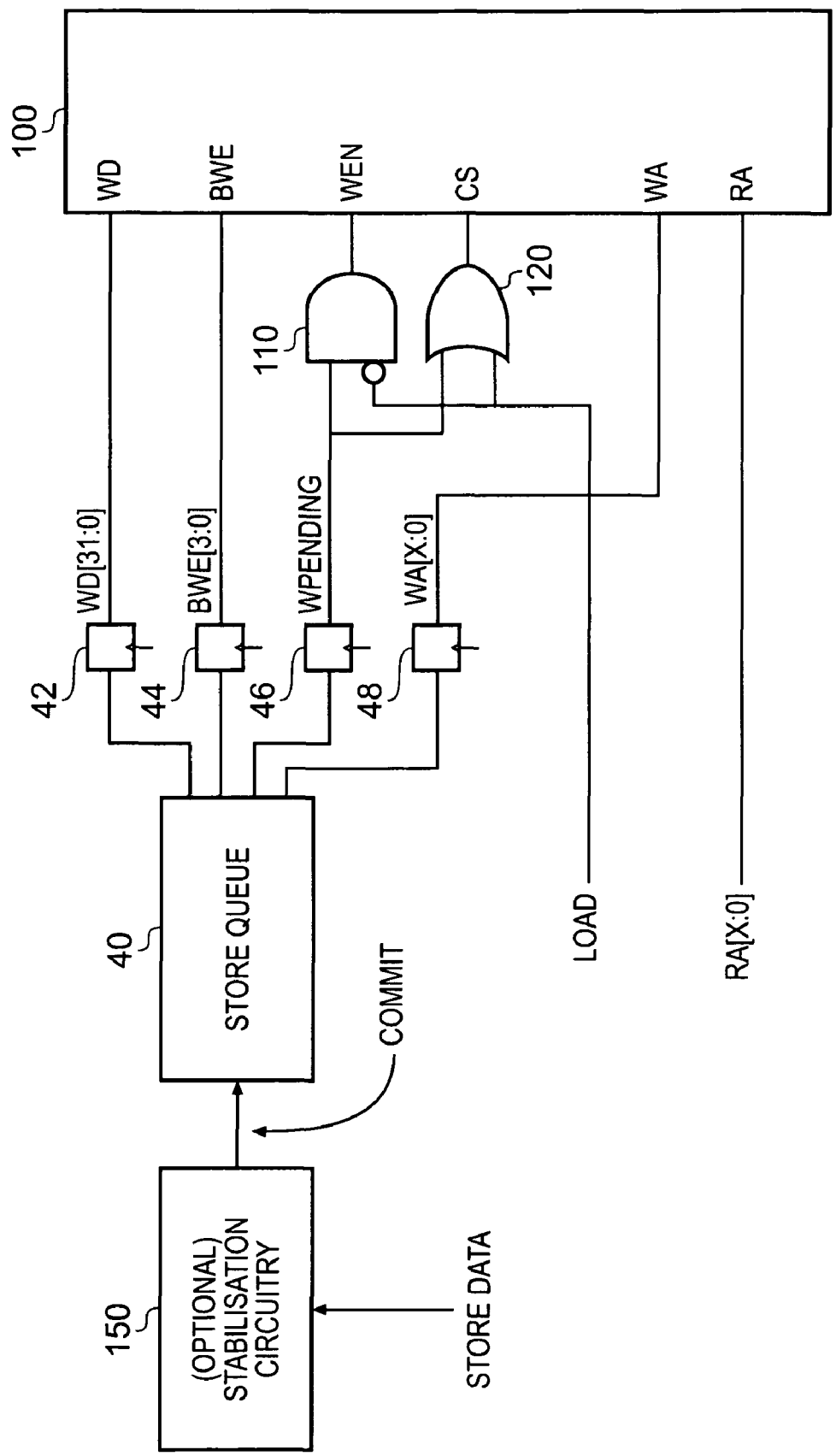
FIG. 3 illustrates an arrangement in accordance with one embodiment for generating signals to be latched by a memory device.

FIG. 3 illustrates an arrangement of interface circuitry as used in one embodiment of the present invention to address this problem. In this embodiment, the store data is again stored in the store queue 40, but if there is any possibility of that store data being incorrect, it is first passed through an optional stabilisation circuit 150 prior to being committed to the store queue. For example, in one embodiment it may be the case that whilst there could be metastability problems in association with the load signal, the write address signals issued by the processing circuit can always be guaranteed not to suffer from any metastability problems, and can be guaranteed to always represent valid write addresses at which the processing circuitry wishes to write data. In that event, the store data can be passed directly to the store queue 40. However, if the write address signals as issued by the processing circuitry cannot be guaranteed to be free from such metastability problems, they can be routed first to the stabilisation circuitry 150 where they can be retained until a system level validation process has been performed to confirm that those write address signals are correct and that no metastability in those signals exists. Only once those values have been fully qualified using the stabilisation circuitry is the data committed from the stabilisation circuit 150 to the store queue 40, thereby ensuring that the outputs from the store queue are guaranteed to be both correct and timing clean.

The latches 42, 44, 46, 48 are identical to those described earlier with FIG. 2, and again the components 110 and 120 are provided as signal handling logic 50. However, in this embodiment, separate read address and write address inputs are provided to respective read address and write address latches within the component 100 thereby avoiding any scrambling of an address input in the event of a metastable load signal.

Figure 4:
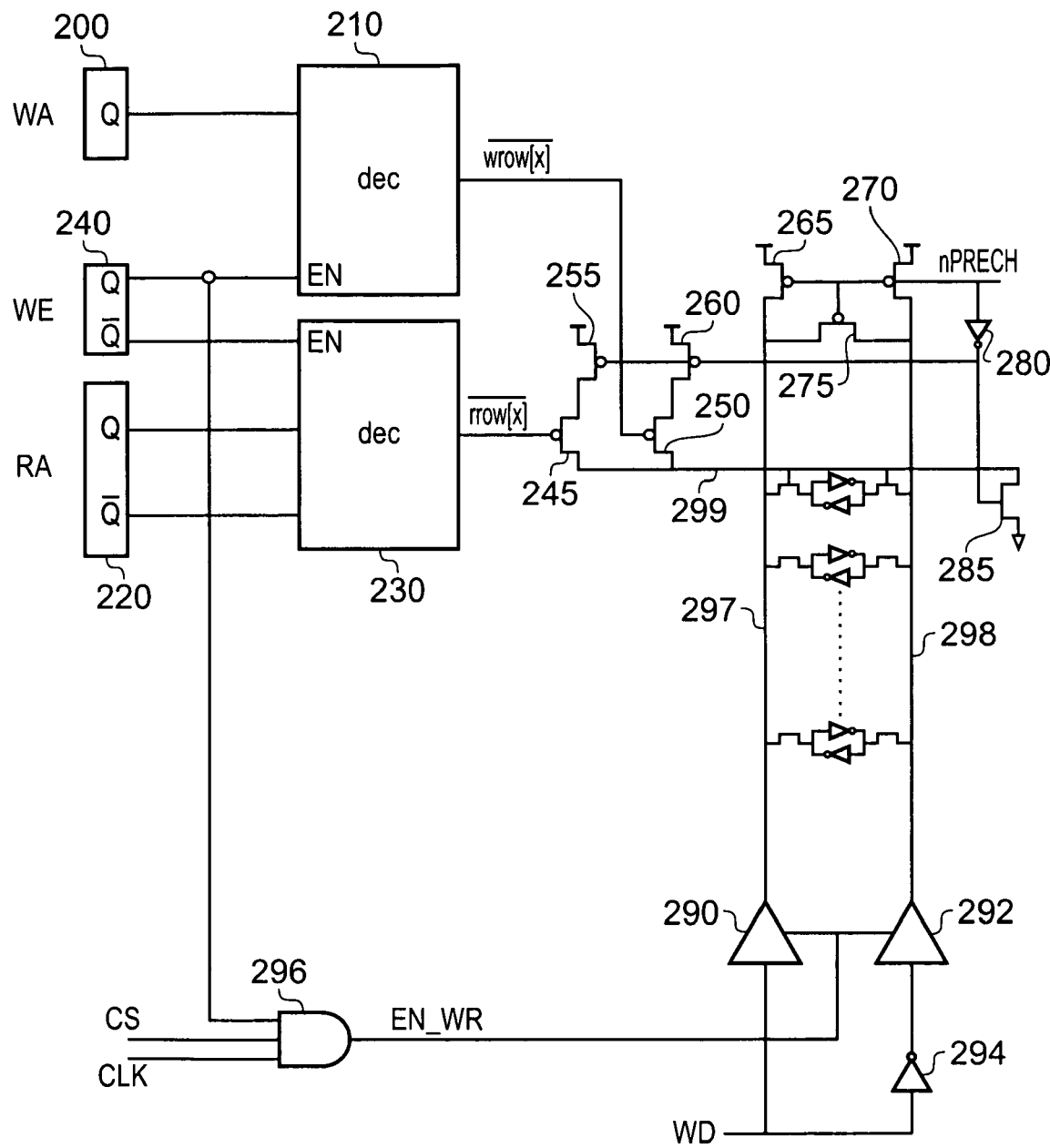
FIG. 4 illustrates in more detail the arrangement of latches and decoder circuits in accordance with one embodiment.

FIG. 4 illustrates in more detail some of the components provided within the block 100 of FIG. 3. A write address latch 200 is used to latch the write address output from the store queue via the latch 48, and a read address latch 220 is used to store the read address provided from the processing circuitry. A write enable latch 240 is also provided for storing the write enable signal produced by the AND gate 110, and as will be discussed in more detail is arranged to generate two output signals Q and $\overline{Q}$ which are used as enable signals for associated decoder circuits. In particular, a write address decoder circuit 210 is provided for decoding the write address stored in the latch 200 in the event of a set enable signal being provided to it from the Q output of the write enable latch 240. Similarly, separate read address decoder circuitry 230 is arranged to decode the read address provided from the read address latch 220 in the event that it receives a set enable signal from the $\overline{Q}$ output of the write enable latch 240.

As will be discussed in more detail later with reference to FIG. 5, during a precharge phase of operation the Q and $\overline{Q}$ outputs from the write enable latch 240 are held at a logic zero value, thereby disabling both the write address decoder 210 and the read address decoder 230. In an active phase following the precharge phase, at most one of those outputs transitions to a logic one level, thereby enabling at most one of the decoder circuits 210, 230. In the event of metastability being detected within the latch 240, it is ensured that at least the $\overline{Q}$ output remains at a logic zero value, thereby disabling at least the read address decoder 230.

Considering the column of memory cells shown in FIG. 4, then the three PMOS transistors 265, 270, 275 act as a precharge circuit which in the event of a set precharge signal, cause the bit lines 297, 298 to be pulled up to a logic one (Vdd) level. During this precharge phase, via the inverter 280, the transistor 285 is turned on and the transistors 255, 260 are turned off, thereby pulling the word line 299 towards ground, ensuring none of the memory cells are activated.

In the active phase, the precharge transistors 265, 270, 275 turn off and the transistor 285 turns off. Further, the transistors 255, 260 then turn on such that if either of transistors 245 or 250 are turned on (only one of them can be turned on since only one of the decoder circuits 210, 230 will be active in the active phase), then the word line 299 is enabled. In particular, if either decoder identifies a particular word line by setting the associated word line signal, then the inverse of that signal is input to the relevant PMOS transistor 245, 250, thereby turning that word line on. In the event that a write operation is taking place, and accordingly a set Q output from the write enable circuit 240 has been issued to enable the write address decoder 210, then an enable signal will be propagated via the AND gate 296 (qualified by the chip select and clock signal) in order to turn on the write drivers 290, 292 in order to cause the required data value to be written into the addressed memory cell. In particular, the write data will be propagated via the driver 290 and the inverse of the write data will be created by the inverter 294 and propagated via the write driver 292.

Figure 5:
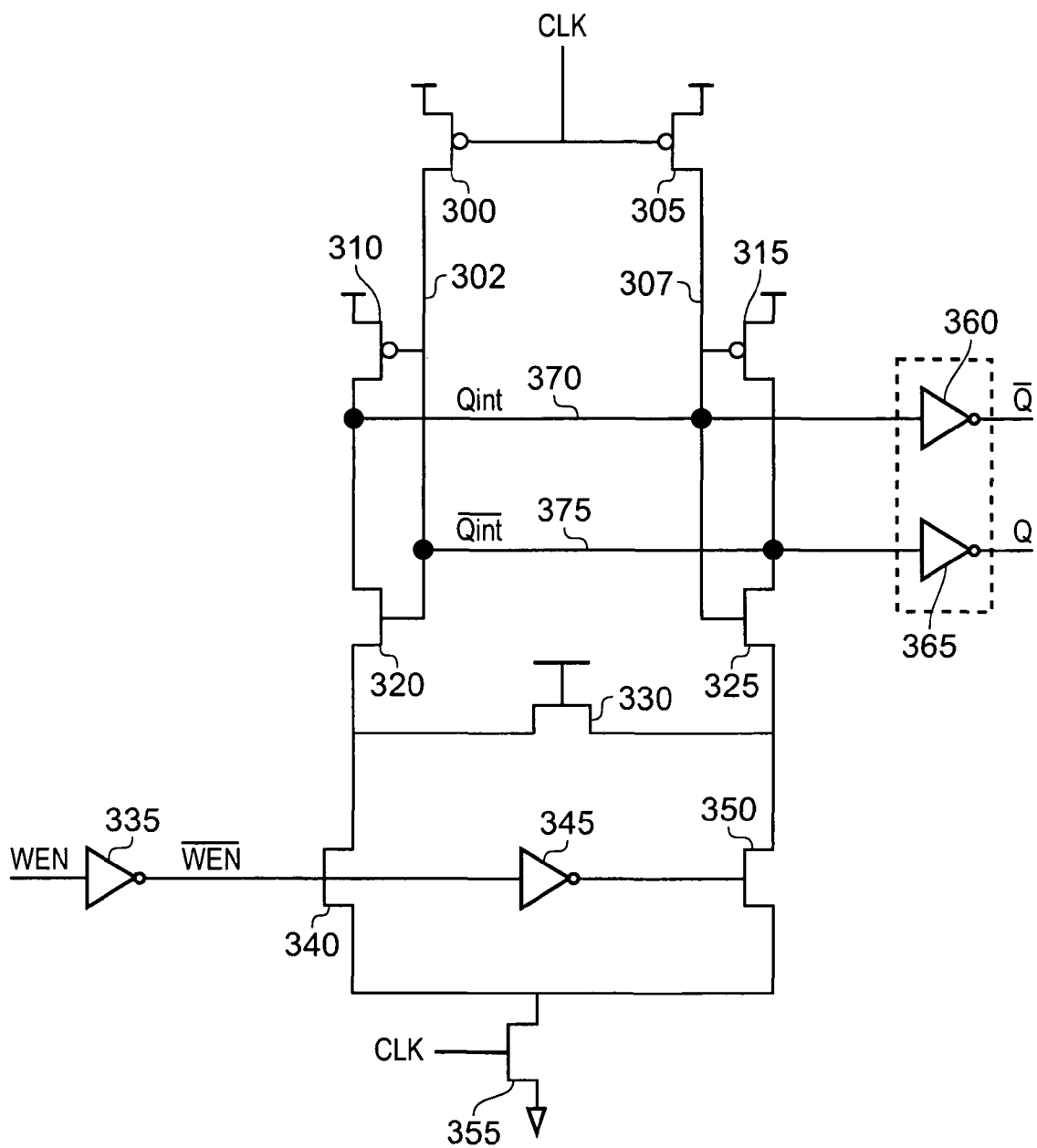
FIG. 5 illustrates one embodiment of the write enable latch of FIG. 4.

FIG. 5 illustrates the structure of the write enable latch 240 in accordance with one embodiment. When the clock signal is low, indicating a precharge stage, then the transistors 300, 305 turn on and the transistor 355 turns off. As a result, the voltage on the input nodes 370, 375 is pulled up towards the Vdd voltage level, and via inverters 360, 365 this causes both the Q and $\overline{Q}$ outputs to be at a logic zero level, thereby disabling both of the decoders 210, 230.

On the transition of the clock signal to Vdd, denoting the evaluate phase, the transistors 300, 305 turn off, and the transistor 355 turns on. If the write enable signal is at a logic zero level, then a logic one value will be produced by the inverter 335, which will turn on the transistor 340, whilst a logic zero value will be output by the inverter 345 which will turn off the transistor 350. Initially the transistors 310, 315 will both be off and the transistors 320, 325 will both be on due to the Vdd level voltage on the internal nodes 370, 375. However, due to transistor 340 also being turned on, the voltage on the internal node 370 will begin to drop and in the event of a stable write enable input this will cause the voltage on the node 370 to transition to a logic zero level whilst the voltage on the node 375 is maintained at a logic one level. As a result, in the event that the write enable signal is at a logic zero level, the $\overline{Q}$ output will be set whilst the Q output will remain unset.

It should be noted that the transistor 330 is arranged to only be weakly conductive, and hence does not influence the above described operation of the circuitry.

If the write enable signal is at a logic one level rather than a logic zero level, it can be seen that transistor 350 turns on instead of transistor 340, and as a result the node 375 is drawn to a logic zero value, thereby causing the Q output to be set high via the inverter 365.

Accordingly, dependent on the value of the write enable signal, then during the active phase one of the Q and $\overline{Q}$ outputs will typically be set. However, in the event of metastability in the feedback loop concerning nodes 370 and 375, then during the active phase there will not be a clean transition of one of the nodes to the logic zero level, and instead the voltage on both internal nodes 370, 375 will hover within a metastable voltage range typically around half of Vdd. Such metastability may occur due to metastability in the write enable input, which will then not be at a logic zero level or a logic one level, but instead will be at a voltage somewhere between the two, typically of the order of half the logic one voltage level. The transfer characteristics of components 335, 345, 320 and 350 are then such that this metastability is effectively transferred to nodes 370 or 375. Alternatively such metastability in the feedback loop concerning nodes 370 and 275 may occur due to the write enable signal transitioning or glitching close to the rising edge of the clock signal. By skewing the transfer characteristics of the inverters 360, 365 it is possible to ensure that in such scenarios, at least the read address decoder is not activated.

Figure 6:
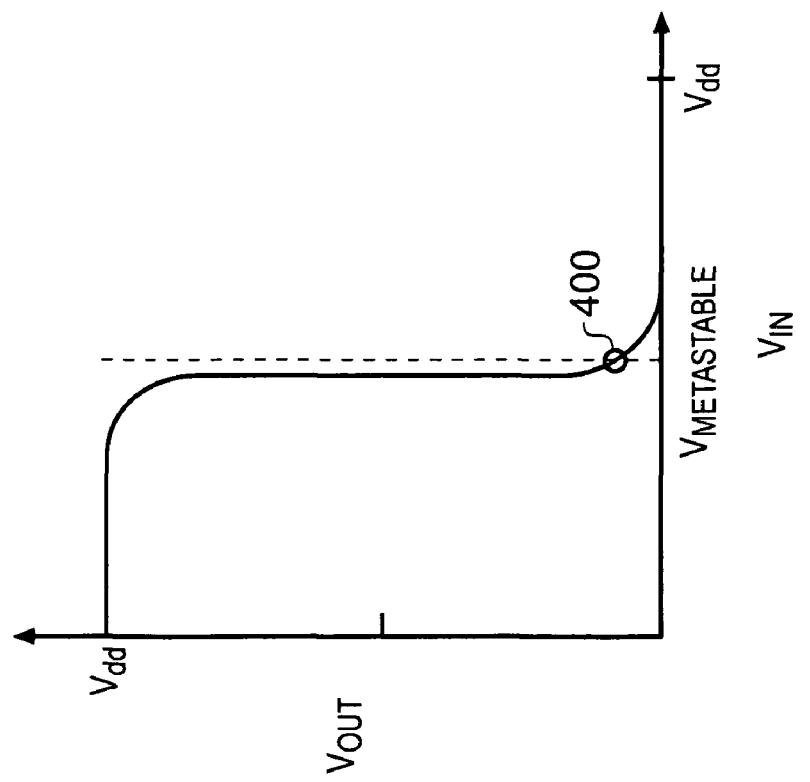

In particular, FIG. 6 shows the transfer characteristic that may be associated with the inverter 360 used to produce the $\overline{Q}$ output used as an enable signal for the read address decoder. The voltage $V_{IN}$ represents the voltage input to the inverter, and as can be seen by point 400, if that voltage is in the metastable voltage range, then the output voltage from the inverter is still close to zero volts, and in particular is at a voltage that will be interpreted by the read address decoder as being unset. Accordingly, the read address decoder will not be enabled.

Figure 7:
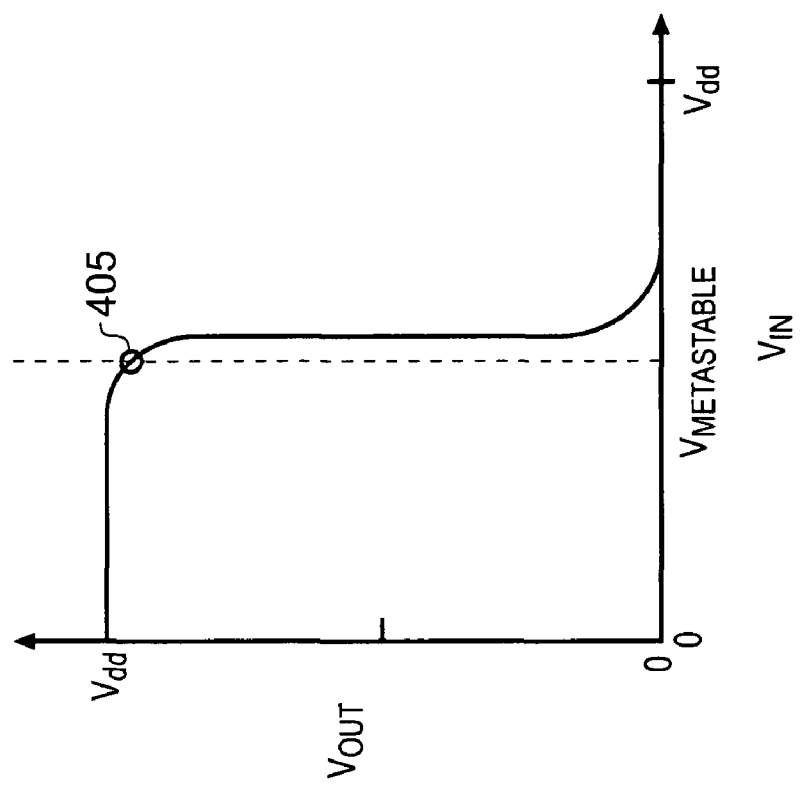
FIGS. 6 and 7 illustrate transfer characteristics that may be associated with the output inverters of the circuit of FIG. 5 in accordance with one embodiment.

The inverter 365 used to produce the Q output provided as an enable signal to the write address decoder 210 may be arranged in an identical manner, so that in the event of metastability, neither the read address decoder 230 nor the write address decoder 210 is enabled. However, in an alternative embodiment, the transfer characteristics of the inverter 365 can be skewed as shown in FIG. 7 such that in the event of a metastable voltage input to the inverter, the output voltage is as shown by the points 405, i.e. is very close to the Vdd voltage level. As a result, the write address decoder will interpret that voltage as a set enable signal, and accordingly the write address decoder will be enabled. Since by virtue of the arrangement shown in FIG. 3 the write address can always be guaranteed to be correct, then this ensures that in the event of metastability in the write enable signal, a write operation is performed, and this write operation will always be performed at an intended address within the memory device, and accordingly will not corrupt state.

As will be appreciated from the above description, the use of the dual address scheme in effect allows the write enable latch to be merged into the address decode tree, such that if the write enable latch is metastable, then either no access to the memory device takes place, or a safe write access using a write address known to be correct takes place, thereby avoiding state corruption.

In the embodiment of FIG. 3 the safe write address location is ensured by virtue of the processing circuitry either always issuing correct write addresses, or by virtue of the stabilisation circuitry 150 ensuring that the write addresses are not committed to the store queue until they are ensured to be correct. However, in an alternative embodiment, in the event of a metastable signal latched within the write enable latch circuit 240, a write to a predetermined address known to be safe (referred to herein as a dummy address) could be invoked if there is any doubt as to the correctness of the information held in the store queue. For example, a dummy address could be defined for a memory location that is not being used by the processing circuitry, and accordingly to which any value could be written without corrupting subsequent operation.

This safe dummy address could be held in the store queue for provision to the write address latch 48 as required, or could alternatively be provided to a multiplexer along with the address output from the store queue 40, with the output of the multiplexer providing an address to the write address latch 48. The control for the multiplexer could be provided by a signal used to cleanly select one input or the other for output to the write address latch, but biased to select the dummy address if there is any prospect of the information held in the store queue being incorrect. For example, the control signal for the multiplexer may be based on a signal indicating late arrival of at least some of the information held in the store queue, such that in the event of late arrival of that information the dummy address is selected.

One scenario where this approach could be used is where entries are held in the store queue, but not all of the information required to complete the write access is always known, and that there is hence, for example, the possibility of the WPENDING signal falling late, thereby potentially causing an erroneous write operation to occur corresponding to the address output by the store queue. Through use of the above dummy address approach, the dummy address will be used for such an erroneous write operation, thereby avoiding any system state corruption occurring.

Thus, in the event of a metastable write enable signal, the write address decoder could be enabled, and the dummy write address could be used in preference to any write address available from the store queue if there is any prospect of the information in the store queue being incorrect.

The write address latch 200 can take a variety of forms, and can be employed as a standard latch given the fact that the write address is always guaranteed to be correct.

As regards the read address, then irrespective of any metastability problems with the load signal that can cause metastability in the write enable signal latched in the write enable latch 240, it is also possible that the read address signals themselves may exhibit some metastability, hence potentially causing metastability in the value latched in the read address latch 220.

To combat such metastability problems, in one embodiment the read address latch circuitry 220 may include a circuit such as that shown in FIG. 5 for each bit of the read address, but with the transfer characteristics of the inverters 360, 365 both skewed as shown in FIG. 6, such that in the event of a metastable address bit, both outputs are maintained at a logic zero level, hence avoiding any word lines being enabled in the event of a metastable address input. In particular, by maintaining both of the outputs at a logic zero level during the active phase if the input is metastable, this causes the address decoder to operate in a manner equivalent to that during the pre-charge period, and prevents the address decoder from selecting multiple word lines. As a consequence, no corruption in the state stored in the memory can result due to inadvertent flow of charge between cells in different rows of the memory. More details of a suitable construction of the read address latch circuitry 220 is provided in the earlier-mentioned commonly owned U.S. Pat. No. 7,263,015, the entire contents of which are hereby incorporated by reference.

The interface circuitry of embodiments of the present invention can be used with a variety of memory devices. However, in one embodiment, the memory device comprises a plurality of RAM cells, and in one particular embodiment comprises a plurality of 6T SRAM cells as for example shown schematically in FIG. 4. The memory device may in one embodiment be a cache associated with the processing circuitry 10. In an alternative embodiment, the memory device may be another storage structure, such as the translation lookaside buffer (TLB) of an MMU associated with the processing circuitry 10.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Interface circuitry for coupling between a memory device and processing circuitry, the processing circuitry being arranged to issue a plurality of access signals relating to accesses to be performed in the memory device, the interface circuitry comprising:
    write address latch circuitry for storing a write address signal;
    write address decoder circuitry responsive to a set first enable signal to decode the write address signal provided from the write address latch circuitry;
    read address latch circuitry for storing a read address signal issued by the processing circuitry;
    read address decoder circuitry responsive to a set second enable signal for decoding the read address signal provided from the read address latch circuitry; and
    decoder select latch circuitry, responsive to an access type indication signal from the processing circuitry, to generate the first and second enable signals in dependence on said access type indication signal, in the event of metastability occurring in the decoder select latch circuitry, the decoder select latch circuitry being arranged to not set at least the second enable signal, thereby disabling at least the read address decoder circuitry in the presence of said metastability.

2. Interface circuitry as claimed in claim 1, wherein in the event of metastability occurring in the decoder select latch circuitry the decoder select latch circuitry is arranged to not set the first enable signal and the second enable signal, thereby disabling both the write address decoder circuitry and the read address decoder circuitry in the presence of said metastability.

3. Interface circuitry as claimed in claim 1, wherein:
    the write address signal in the write address latch circuitry identifies a location in the memory device at which performance of a write operation will not corrupt state required for future processing by the processing circuitry; and
    in the event of metastability occurring in the decoder select latch circuitry, the decoder select latch circuitry is arranged to set the first enable signal and to not set the second enable signal, thereby enabling the write address decoder circuitry and disabling the read address decoder circuitry in the presence of said metastability.

4. Interface circuitry as claimed in claim 3, further comprising:
    a store buffer for buffering one or more write address signals issued by the processing circuitry, each write address signal only being output from the store buffer when determined to identify a location in the memory device at which performance of a write operation will not corrupt further operation of the processing circuitry; and
    said write address latch circuitry being arranged to store a write address signal as output by the store buffer.

5. Interface circuitry as claimed in claim 4, wherein the write address signals issued by the processing circuitry are speculative, and the interface circuitry further comprises:
    stabilization circuitry for receiving the write address signals issued by the processing circuitry, resolving those signals to non-speculative signals, and then providing the non-speculative write address signals to the store buffer.

6. Interface circuitry as claimed in claim 1, wherein:
    said decoder select latch circuitry has first and second internal nodes, said first enable signal being derived from a logic level of said first internal node, and said second enable signal being derived from a logic level of said second internal node;
    in a precharge phase, said first and second internal nodes are precharged to a first logic level, causing both the first and second enable signals to be unset;
    in an active phase following the precharge phase, at most one of the first and second internal nodes is caused to transition towards a second logic level in dependence on said received access type indication signal, causing at most one of the first and second enable signals to be set; and
    in the event of metastability occurring in the decoder select latch circuitry during the active phase, at least the second internal node being prevented from transitioning towards the said second logic level to a degree that would cause the second enable signal to be set.

7. Interface circuitry as claimed in claim 6, wherein said decoder select latch circuitry comprises:

a capture element containing said first and second internal nodes;

a first inverter for producing said first enable signal from the logic level of said first internal node; and a second inverter for producing said second enable signal from the logic level of said second internal node;

at least the second inverter having a transfer characteristic which prevents the second enable signal being set in the event of metastability in the logic level at the second internal node, thereby disabling at least the read address decoder circuitry in the presence of said metastability.

8. Interface circuitry as claimed in claim 7, wherein the transfer characteristic of at least the second inverter is skewed such that the voltage on the second internal node needs to transition beyond a metastable voltage level towards a voltage associated with the second logic level before the second inverter sets the second enable signal.

9. Interface circuitry as claimed in claim 7, wherein the first inverter has a transfer characteristic which causes the first enable signal to be set in the event of metastability in the logic level at the first internal node, thereby enabling the write address decoder circuitry in the presence of said metastability.

10. Interface circuitry as claimed in claim 9, wherein the transfer characteristic of the first inverter is skewed such that if the voltage on the first internal node transitions to a metastable voltage level this causes the first inverter to set the first enable signal.

11. Interface circuitry as claimed in claim 1, wherein said access type indication signal is used to produce a write enable signal stored in the decoder select latch circuitry.

12. Interface circuitry as claimed in claim 1, wherein said read address latch circuitry comprises for each bit of the read address signal:

a capture element having first and second internal nodes, from which first and second read address output signals are derived;

in a precharge phase, said first and second internal nodes are precharged to a first logic level, causing both the first and second read address output signals to be unset;

in an active phase following the precharge phase, at most one of the first and second internal nodes is caused to transition towards a second logic level in dependence on said received read address signal, causing at most one of the first and second read address output signals to be set; and in the event of metastability occurring in the capture element during the active phase, both the first and second internal nodes being prevented from transitioning towards the said second logic level to a degree that would cause either of the first and second read address output signals to be set;

the read address decoder preventing a read access to the memory device taking place in the event that the first and second read address output signals are both unset.

13. Interface circuitry as claimed in claim 12, wherein the read address latch circuitry further comprises for each bit of the read address signal:

a first inverter for producing said first read address output signal from the logic level of said first internal node; and a second inverter for producing said second read address output signal from the logic level of said second internal node;

said first and second inverters having a transfer characteristic which prevents the first and second read address output signals being set in the event of metastability in the logic level at the first and second internal nodes.

14. Interface circuitry as claimed in claim 1, wherein the memory device comprises a plurality of RAM memory cells.

15. Interface circuitry as claimed in claim 14, wherein the memory device is part of a cache.

16. Interface circuitry as claimed in claim 14, wherein the memory device is a storage structure within a memory management unit.

17. Interface circuitry as claimed in claim 14, wherein:

the memory device is a RAM based FIFO storage structure;

the processing circuitry forms consuming circuitry for reading data stored in the FIFO storage structure;

the write address signal identifies a location within the FIFO storage structure to which data is to be written; and the read address signal identifies a location within the FIFO structure from which the processing circuitry is to read the data.

18. Interface circuitry for coupling between memory means and processing means, the processing means for issuing a plurality of access signals relating to accesses to be performed in the memory means, the interface circuitry comprising:

write address latch means for storing a write address signal;

write address decoder means, responsive to a set first enable signal, for decoding the write address signal provided from the write address latch means;

read address latch means for storing a read address signal issued by the processing means;

read address decoder means, responsive to a set second enable signal, for decoding the read address signal provided from the read address latch means; and decoder select latch means, responsive to an access type indication signal from the processing means, for generating the first and second enable signals in dependence on said access type indication signal, in the event of metastability occurring in the decoder select latch means, the decoder select latch means not setting at least the second enable signal, thereby disabling at least the read address decoder means in the presence of said metastability.

19. A method of coupling a memory device to processing circuitry, the processing circuitry being arranged to issue a plurality of access signals relating to accesses to be performed in the memory device, the method comprising the steps of:

storing a write address signal in write address latch circuitry;

responsive to a set first enable signal, decoding the write address signal provided from the write address latch circuitry;

storing in read address latch circuitry a read address signal issued by the processing circuitry;

responsive to a set second enable signal, decoding the read address signal provided from the read address latch circuitry;

responsive to an access type indication signal from the processing circuitry, generating from decoder select latch circuitry the first and second enable signals in dependence on said access type indication signal; and in the event of metastability occurring in the decoder select latch circuitry, not setting at least the second enable signal, thereby disabling at least the decoding of the read address signal in the presence of said metastability.

* * * * *